(12) United States Patent  
Sun et al.

(10) Patent No.: US 7,319,935 B2
(45) Date of Patent: Jan. 15, 2008

(54) SYSTEM AND METHOD FOR ANALYZING ELECTRICAL FAILURE DATA

(75) Inventors: Xueqing Sun, Manassas, VA (US); Mark Eyolfson, Boise, ID (US); Chris Langworthy, Boise, ID (US); Karl L. Major, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 10/365,997

(22) Filed: Feb. 12, 2003

(65) Prior Publication Data

US 2004/0158783 A1    Aug. 12, 2004

(51) Int. Cl.
  *G01R 31/00*  (2006.01)
(52) U.S. Cl. .................... 702/59; 356/237.4
(58) Field of Classification Search ............ 702/57–59, 702/68, 81, 117–120, 150, 179, 62, 80, 90, 702/122, 168, 182–184, 188; 700/58, 83, 700/95; 438/10, 14, 17; 714/25, 37; 365/201; 382/141; 356/237.1, 237.2, 237.4
See application file for complete search history.

(56) References Cited

U.S. PATENT DOCUMENTS

| | | | |
|---|---|---|---|
| 4,209,257 A | 6/1980 | Uchiyama et al. ......... 356/394 |
| 4,376,583 A | 3/1983 | Alford et al. .............. 356/237 |
| 4,778,745 A | 10/1988 | Leung ....................... 430/311 |
| 4,791,586 A | 12/1988 | Maeda et al. .............. 364/491 |
| 5,103,166 A | 4/1992 | Jeon et al. ................. 324/158 |
| 5,127,726 A | 7/1992 | Moran ....................... 356/237 |
| 5,240,866 A | 8/1993 | Friedman et al. .............. 437/8 |
| 5,294,812 A | 3/1994 | Hashimoto et al. .......... 257/65 |
| 5,301,143 A | 4/1994 | Ohri et al. .................... 365/96 |
| 5,497,381 A * | 3/1996 | O'Donoghue et al. ...... 714/745 |
| 5,539,752 A | 7/1996 | Berezin et al. ............ 371/22.1 |
| 5,544,256 A | 8/1996 | Brecher et al. ............ 382/149 |
| 5,550,372 A | 8/1996 | Yasue ......................... 250/310 |
| 5,760,892 A * | 6/1998 | Koyama .................. 356/237.1 |
| 5,841,893 A * | 11/1998 | Ishikawa et al. ........... 382/145 |
| 5,963,314 A * | 10/1999 | Worster et al. .......... 356/237.2 |
| 6,072,574 A | 6/2000 | Zeimantz | |
| 6,081,037 A * | 6/2000 | Lee et al. .................... 257/778 |
| 6,175,417 B1 | 1/2001 | Do et al. | |
| 6,185,322 B1 * | 2/2001 | Ishikawa et al. ............ 382/141 |
| 6,259,520 B1 * | 7/2001 | Zeimantz ................. 356/237.4 |
| 6,272,236 B1 | 8/2001 | Pierrat et al. | |
| 6,373,566 B2 | 4/2002 | Zeimantz ................. 356/237.4 |
| 6,373,976 B1 | 4/2002 | Pierrat et al. | |
| 6,415,977 B1 | 7/2002 | Rumsey | |
| 6,417,015 B2 | 7/2002 | Nuttall et al. | |
| 6,441,897 B1 | 8/2002 | Zeimantz | |
| 6,452,677 B1 | 9/2002 | Do et al. | |

(Continued)

OTHER PUBLICATIONS

"Chapter 1: Introduction", *Guide to the ESDA Toolkit, v5.3, TI Proprietary-Internal Data*, (1999), 1-12.

Primary Examiner—Marc S. Hoff
Assistant Examiner—Mohamed Charioui
(74) *Attorney, Agent, or Firm*—Schwegman, Lundberg, Woessner & Kluth, P.A.

(57) ABSTRACT

A system and method to perform analysis on test results of multiple integrated circuits. Based on the analysis, the system and method display a wafer map having map indicators representing statistical values of the test results.

66 Claims, 16 Drawing Sheets

U.S. PATENT DOCUMENTS

| | | |
|---|---|---|
| 6,504,948 B1 * | 1/2003 | Schemmel et al. ......... 382/149 |
| 6,509,750 B1 * | 1/2003 | Talbot et al. ............... 324/750 |
| 6,567,168 B2 * | 5/2003 | Nara et al. .................. 356/394 |
| 6,567,770 B2 * | 5/2003 | Dorough ..................... 702/188 |
| 6,618,682 B2 * | 9/2003 | Bulaga et al. ................ 702/84 |
| 6,788,993 B2 | 9/2004 | Beffa |
| 6,792,373 B2 * | 9/2004 | Tabor ......................... 702/108 |
| 6,859,760 B2 | 2/2005 | Dorough |
| 6,888,159 B2 | 5/2005 | Farnworth et al. |
| 6,890,775 B2 | 5/2005 | Simmons |
| 2004/0036863 A1 * | 2/2004 | Matsusita et al. ........ 356/237.2 |

* cited by examiner

700

FABRICATION AREA 1
⋮
FABRICATION AREA M
ALL FABRICATION AREAS
WAFERS BY GROUP
WAFERS BY DATE RANGE
TEST PROGRAM
LAYOUT TYPE
DESIGN ID
FAILURE CATEGORY

FIG. 7

| FAILURE CATEGORY | WAFER 1 | WAFER 2 | WAFER 3 | STATISTICAL VARIABLES | | | |
|---|---|---|---|---|---|---|---|
| | | | | $T(x_i, y_j)$ | $D(x_i, y_j)$ | $A(x_i, y_j)$ | $M(x_i, y_j)$ |
| A | | | | | | | |
| B | 3 | 5 | 0 | 8 | 2 | 2.67 | 0.67 |
| C | | | | | | | |
| ·· | | | | | | | |
| ZZ | | | | | | | |

SYSTEM AND METHOD FOR ANALYZING ELECTRICAL FAILURE DATA

FIELD

The present invention relates generally to semiconductor devices, more particularly to analysis of electrical failures of semiconductor devices.

BACKGROUND

Semiconductor devices are usually fabricated on wafers. Typically, hundreds of identical devices are fabricated on the same wafer. The devices on the wafer are cut into single pieces. Each piece is individually packaged and becomes a chip such as a memory device or a microprocessor.

At the end of fabrication process, the devices on the wafer are tested for many electrical functions. Electrical failures are major contributors to the yield loss in semiconductor device fabrication. To improve the yield, failure analysis is often performed on test results to help correct the failures. However, the test results accumulate over time and may be massive and complex, causing the failure analysis to become difficult and time consuming. Furthermore, the test results may incorporate multiple failure mechanisms, which may be very hard to decouple.

SUMMARY OF THE INVENTION

The present invention provides a system and method for an efficient analysis of electrical failures of semiconductor devices.

In one aspect, the system includes an input device for inputting requested information. A controller retrieves data associated with a group of wafers based on the requested information. Each wafer in the group of wafers includes one or more circuit dice. Each of the circuit dice is located at a coordinate. A calculating unit performs a calculation on the data. A display unit displays results from the calculation in the form of a wafer map. The wafer map includes many map sections representing the circuit dice of the group of wafers. Each of the map sections includes an indicator representing a calculation result for circuit dice located at the same coordinate among the wafers.

Another aspect provides a method for analyzing electrical failures of semiconductor devices. The method includes inputting requested information and retrieving data associated with a group of wafers based on the requested information. Each wafer in the group of wafers includes one or more circuit dice. Each of the circuit dice is located at a coordinate. The method further includes performing a calculation on the data and displaying a wafer map, in which the wafer map includes a plurality of map sections representing the circuit dice of the group of wafers. Each of the map sections includes an indicator representing a calculation result for circuit dice located at the same coordinate among the wafers.

BRIEF DESCRIPTION OF THE DRAWINGS

FIG. 7 is a list showing an example of requested information used in a method according to an embodiment of the invention.

FIG. 11 is a table showing results of the analysis performed by a method according to an embodiment of the invention.

DETAILED DESCRIPTION OF THE EMBODIMENTS

Figure 1:
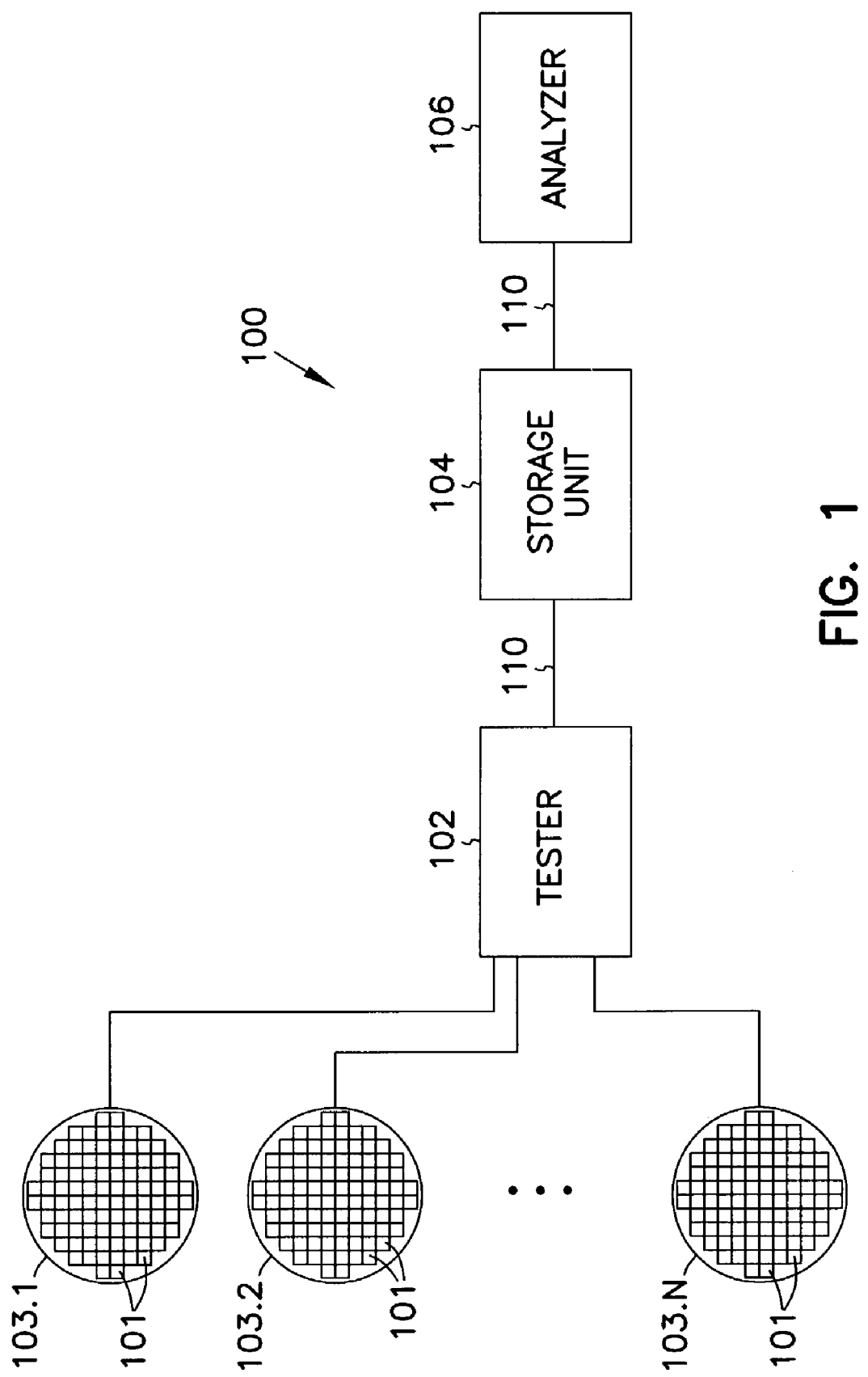
FIG. 1 shows a system according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a system according to an embodiment of the invention. System 100 includes a tester 102, a storage unit 104, and an analyzer 106, all connected together via connections 110. Tester 102 tests electrical functions in integrated circuit (ICs) 101 of a number of wafers 103.1–103.N. ICs 101 are also referred to as dice or circuit dice. Storage unit 104 stores test results from tester 102. Analyzer 106 analyzes the test results. The results from analyzer 106 can be studied to analyze any failures to improve the quality and the yield of devices fabricated on wafers 103.1–103.N.

Connection 110 includes any data transmission medium. For example, connection 110 can be any combination of the following: network cable, telephone line, coax cable, fiber optic cable, radio signal, and satellite signal.

In some embodiments, any combination of tester 102, storage 104, and computer may be included in the same unit. For example, tester 102 and storage 104 may be included in the same unit located at one location and analyzer 106 may be a computer located at another location.

Figure 2:
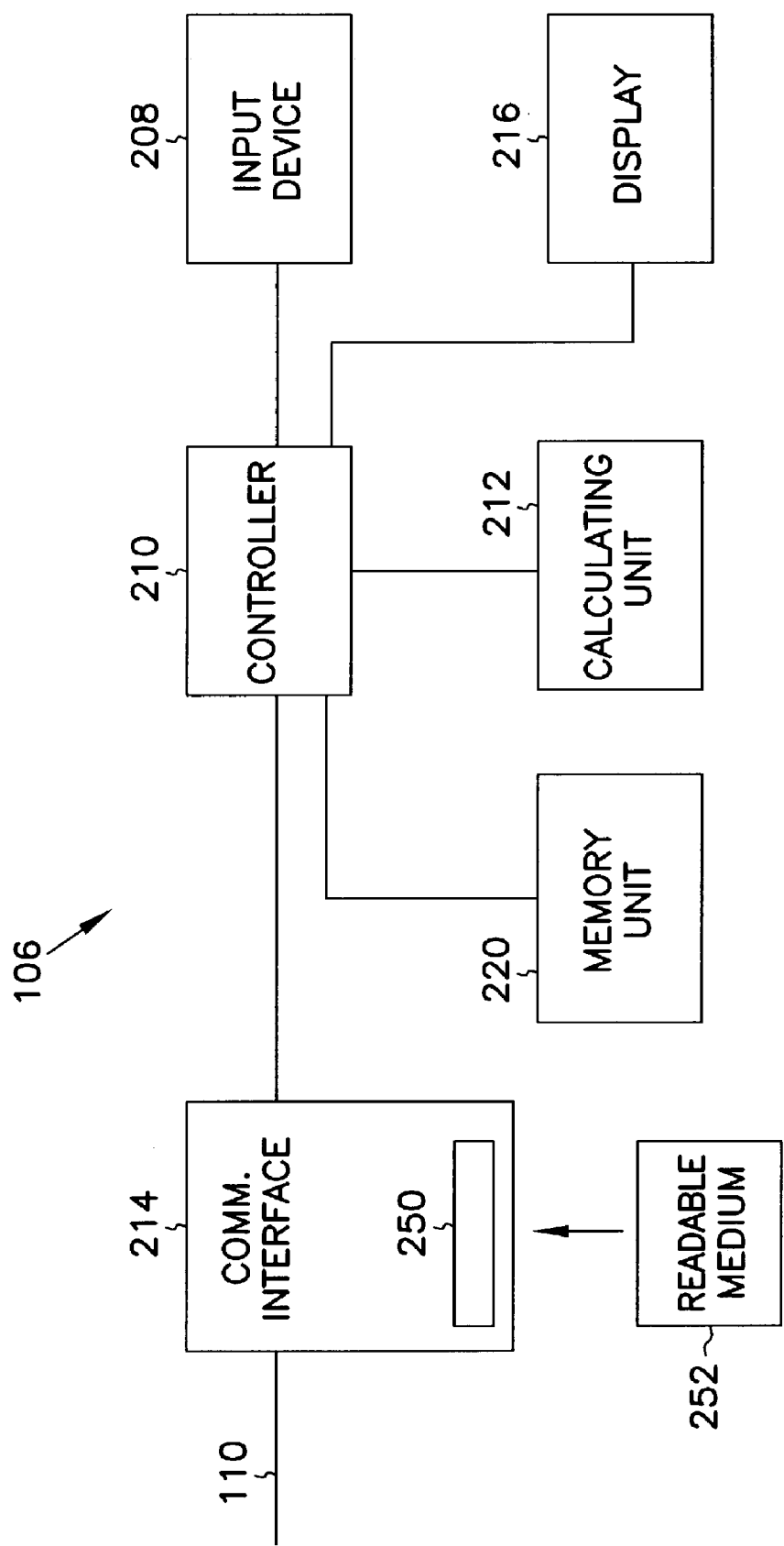
FIG. 2 shows more details of an analyzer of FIG. 1.

FIG. 2 shows more detail of the analyzer of FIG. 1. Analyzer 106 includes an input device 208 for inputting data. A controller 210 connects to input device 208 for controlling data communication to and from analyzer 106. A calculating unit 212 connects to controller 210 for performing math functions. A communication interface 214 transfers data to and from analyzer 106. A memory unit 220 holds data. A display unit 216 displays data and graphics.

Input device 208 includes any combination of a keyboard, a computer mouse, a touch pad, and other devices used for inputting data.

Controller 210 can include a processor, a microprocessor, an application specific integrated circuit, or other types of circuits. In some embodiments, controller 210 can include instructions for performing analysis on the test results.

Calculating unit 212 includes hardware, software, or a combination of both hardware and software. Examples of software include programming instructions that can be stored in memory devices. Examples of hardware include devices such as EPROM, EEPROM, flash memory, and microprocessors that can be programmed to perform math functions. Other examples of hardware include logic circuits.

Communication interface 214 includes any combination of a modem, a network card, a wireless receiver, a wireless transmitter, and other types of communication interfaces. Communication interface 214 further includes a machine readable unit 250 for reading data such as programming instructions from a machine readable medium 252. In some embodiments, analyzer 106 is a computer and machine readable medium 252 can be a magnetic medium, an optical medium, or other storage medium known in the art. Machine readable medium 252 can be portable and removable. An example of a magnetic medium includes a floppy disk or a tape cartridge. An example of an optical medium includes a compact disk.

Memory unit 220 includes any combination of a dynamic random access memory (DRAM) device, a static random access memory (SRAM) device, a flash memory device, EPROM, EEPROM, a magnetic storage device such as those used in a computer hard drive, and other types of memory devices. In some embodiments, memory unit 220 is used to store applications, programs, or instructions for performing analysis on the test results.

During an analyzing process, requested information is inputted using input device 208. Examples of the requested information include fabrication area, design ID, failure category, and range of test date. Based on the requested information, controller 210 causes communication interface 214 to retrieve data (test results) via communication line 110. In some embodiments, the data is transferred and stored in memory unit 220. Calculating unit 212 performs math functions such as statistical functions on the data. Display 216 displays the results of the calculation.

Figure 3:
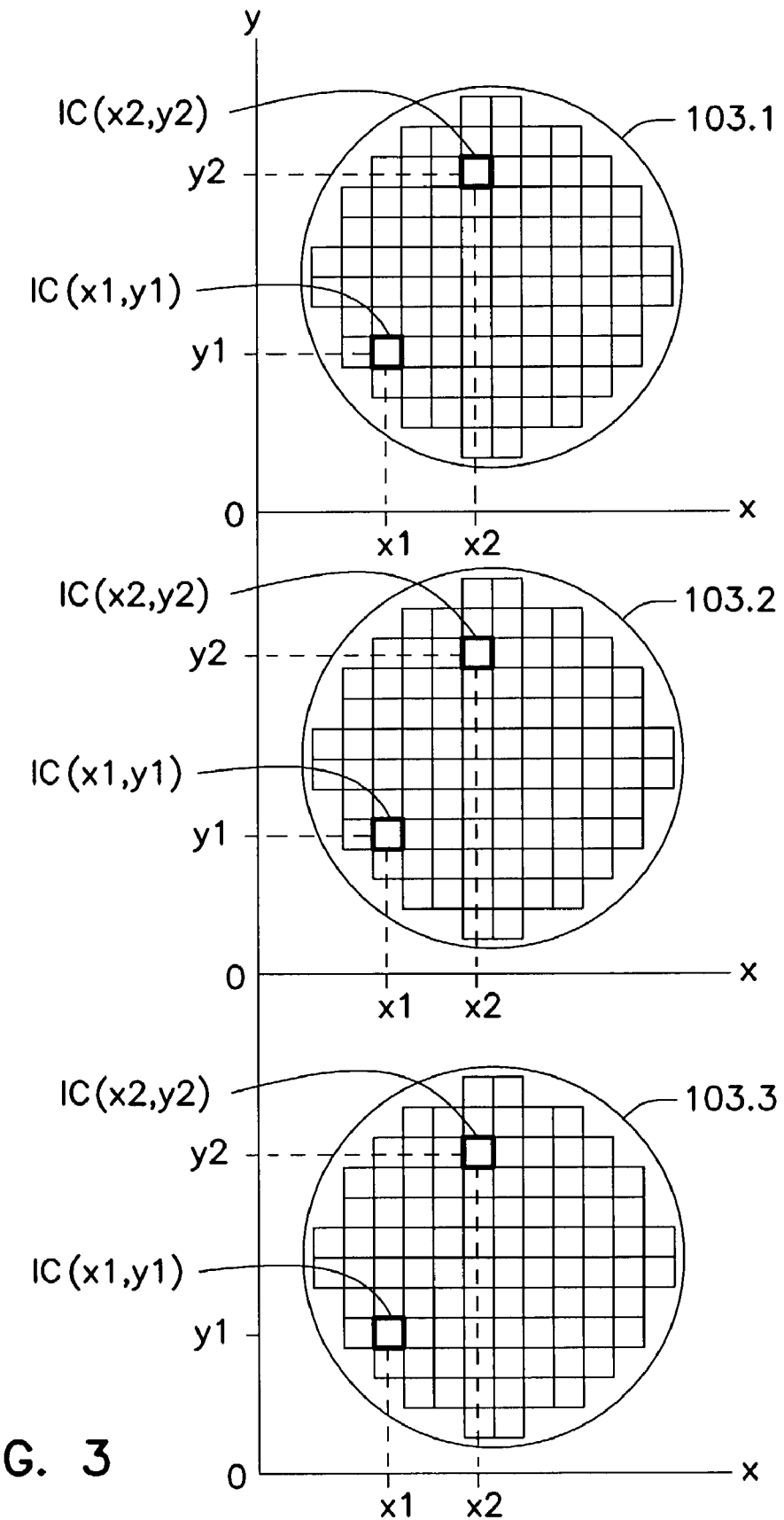
FIG. 3 shows more details of a number of wafers of FIG. 1.

FIG. 3 shows more details of the wafers of FIG. 1. For simplicity, FIG. 3 shows three wafers (i.e. N=3): 103.1, 103.2, and 103.3. Each of the wafers 103.1, 103.2, and 103.3 has a coordinate system represented by the x-y coordinate. The x-y coordinate systems of all wafers are the same. For ease of understanding the description, the x-axis in FIG. 3 are lined up. In the y-axis, y1 values of all wafers are equal. Likewise, y2 values of all wafers are equal.

ICs 101 of each of the wafers 103.1–103.3 may be memory devices, processors, or other types of integrated circuits. The physical location of each of the ICs 101 is identified by an (x,y) coordinate pair (x,y location). For example, in wafer 103.1, IC(x1,y1) is located at coordinate x1, y1 and IC(x2,y2) is located at coordinate (x2,y2). Similarly, wafers 103.2 and 103.3, IC(x2,y2) also have IC(x1,y1) located at coordinate x1,y1 and IC(x2,y2) is located at coordinate (x2,y2). Thus, for N wafers, there are N integrated circuits 101 at each (x,y) (or at the same) coordinate.

During manufacturing, the ICs 101 of each of the wafers 103.1–103.3 are tested. Test results are stored for analysis. In some embodiments, the test results include the numbers (occurrences) of electrical failures in certain failure categories. There are many failure categories. Thus, the test results may include a number of failures in one or more failure categories. For example, when ICs 101 are memory devices, the failure categories may include single memory cell failure, entire row or column of memory cells failure, sense amplifier failure, and other kinds of failure categories. In the example, for each of the ICs 101 in each of the wafers 103.1–103.3, the test results may include a different number of failures in a different one of these failure categories.

Figure 4:
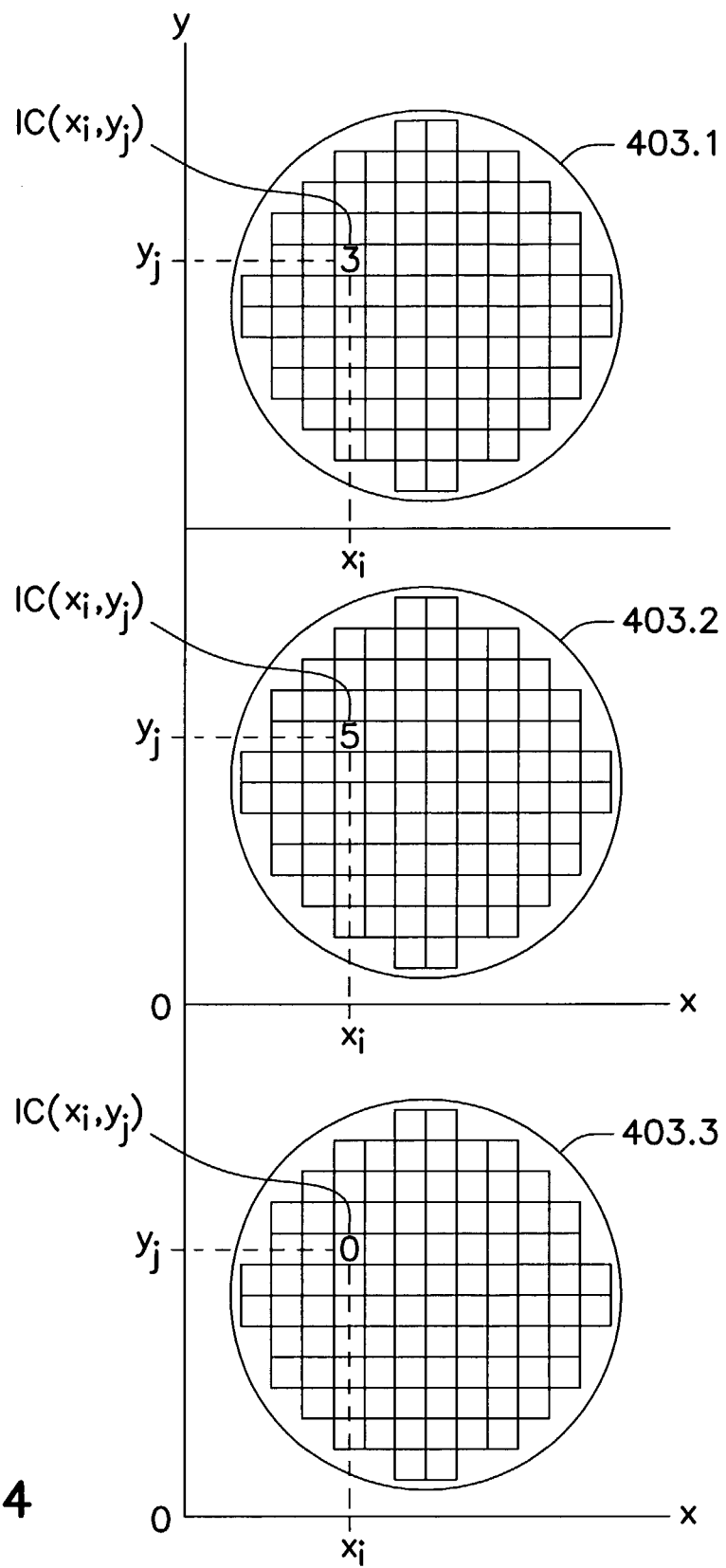
FIG. 4 is a number of wafer maps showing an example of test results for a certain failure category according to an embodiment of the invention.

FIG. 4 is a number of wafer maps showing an example of test results for a certain failure category according to an embodiment of the invention. In this example, wafer maps 403.1–403.3 represent wafers 103.1–103.3 (FIG. 3). In some embodiments, each of the wafer maps 403.1–403.3 may be displayed separately on display 216 (FIG. 2) after analyzer 106 (FIG. 1 and FIG. 2) analyzes the test results from storage unit 104 (FIG. 1).

Each of the wafer maps 403.1–403.3 shows test results of a single wafer. For example, wafer map 403.1 shows test results for only wafer 103.1. Wafer map 403.2 shows test results for only wafer 103.2. And wafer map 403.3 shows test results for only wafer 103.3. Each failure category has its own wafer map. Wafer maps 403.1–403.3 show test results for only one failure category.

Each of the wafer maps 403.1–403.3 shows a number at a particular IC location. For example, each of the wafer maps 403.1–403.3 shows the number 3, 5 or 0 at IC (circuit die) located at coordinate $(x_i, y_j)$. Each of the numbers 3, 5 and 0 represents the number of failures in a failure category of an IC at a particular coordinate $(x_i, y_j)$.

In this description, $IC(x_i, y_j)$ refers to an IC (circuit die) located at coordinate $(x_i, y_j)$ or location $(x_i, y_j)$. For the failure category in this example, wafer map 403.1 shows $IC(x_i, y_j)$ has three failures. Wafer map 403.2 shows $IC(x_i, y_j)$ has five failures. And wafer map 403.3 shows $IC(x_i, y_j)$ has no failures.

FIG. 4 shows an example of test results for only one failure category of ICs at coordinate $(x_i, y_j)$. ICs at other coordinates may have other test results but are omitted for simplicity. Further, wafer maps 403.1–403.3 show test results for only one failure category. Other failure categories have their own maps.

Figure 5:
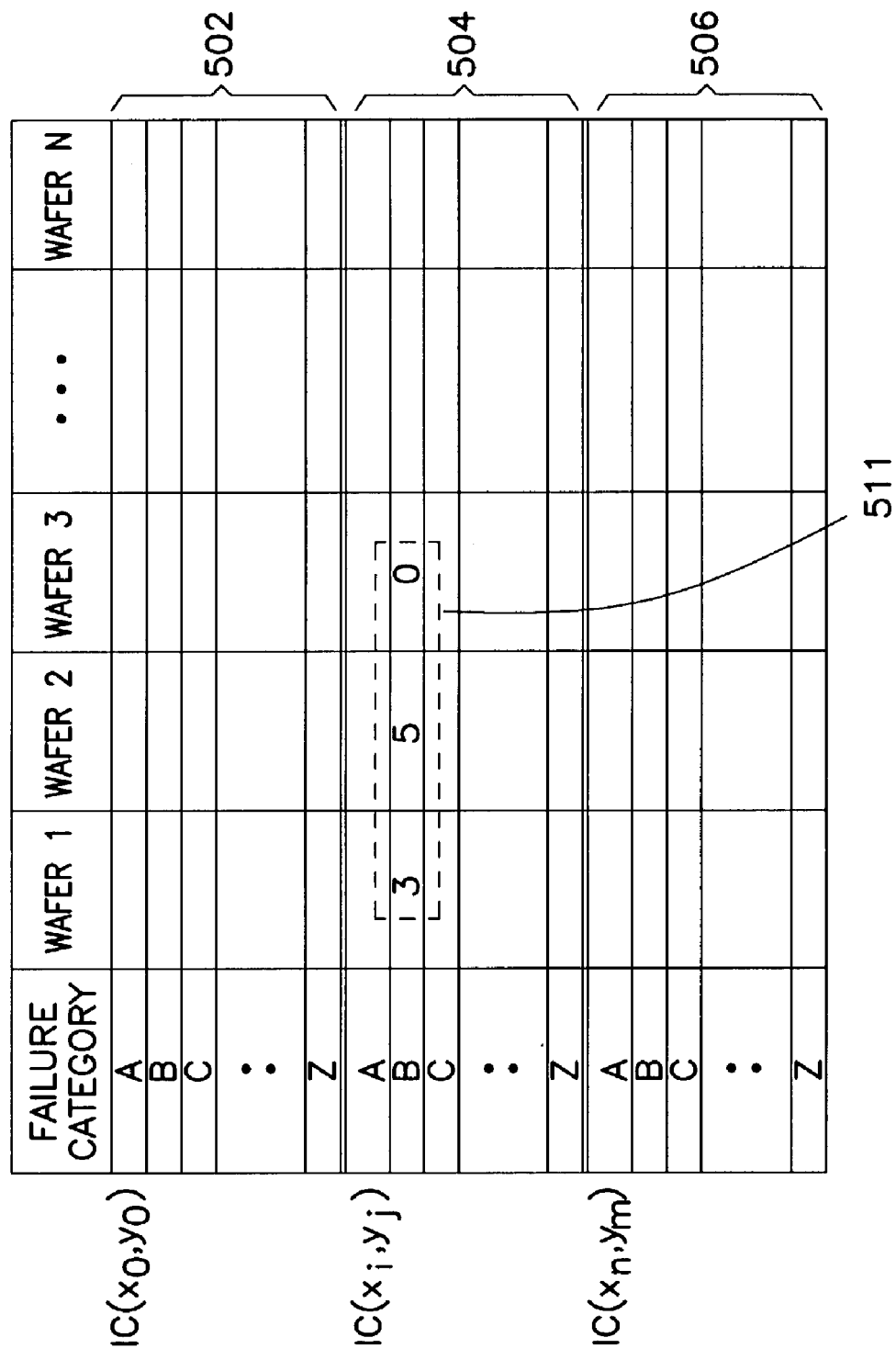
FIG. 5 is a table showing an example of test results for many failure categories according to an embodiment of the invention.

FIG. 5 is a table showing an example of test results for many failure categories according to an embodiment of the invention. In this example, there are failure categories A to Z, each representing a different test on the ICs of the wafers such as wafers 103.1–103.N (FIG. 1). The A through Z failure categories are only examples. The number of failure categories can be any number.

Portion 502 shows test results for failure categories A through Z of the IC at coordinate $(x_0, y_0)$. Portion 504 shows test results for failure categories A through Z of the IC at coordinate $(x_i, y_j)$. Portion 506 shows test results for failure categories A through Z of the IC at coordinate $(x_n, y_m)$. FIG. 5 shows test results in the form of a table, whereas FIG. 4 shows test results in the form of wafer maps. Thus, both table and wafer maps may be used to show test results. For example, the test results of the example in FIG. 4 are shown in section 511 of FIG. 5. For simplicity, FIG. 5 omits other test results of ICs at other coordinates such as the IC at coordinate $(x_0,y_0)$ and the IC at coordinate $(x_n,y_m)$.

As can be seen from FIG. 5, the test results are proportional to the number of failure categories and the number of wafers being tested. In some embodiments, different wafers are tested at the same time. In other embodiments, different wafers are tested at different times. The test results may be accumulated over time, for example, days, weeks, months, etc. Thus, when the number of failure categories and the number of wafers N increase, the number (quantity) of the test results also increases. Hence, when N is large, the number of the test results can be massive.

Figure 6:
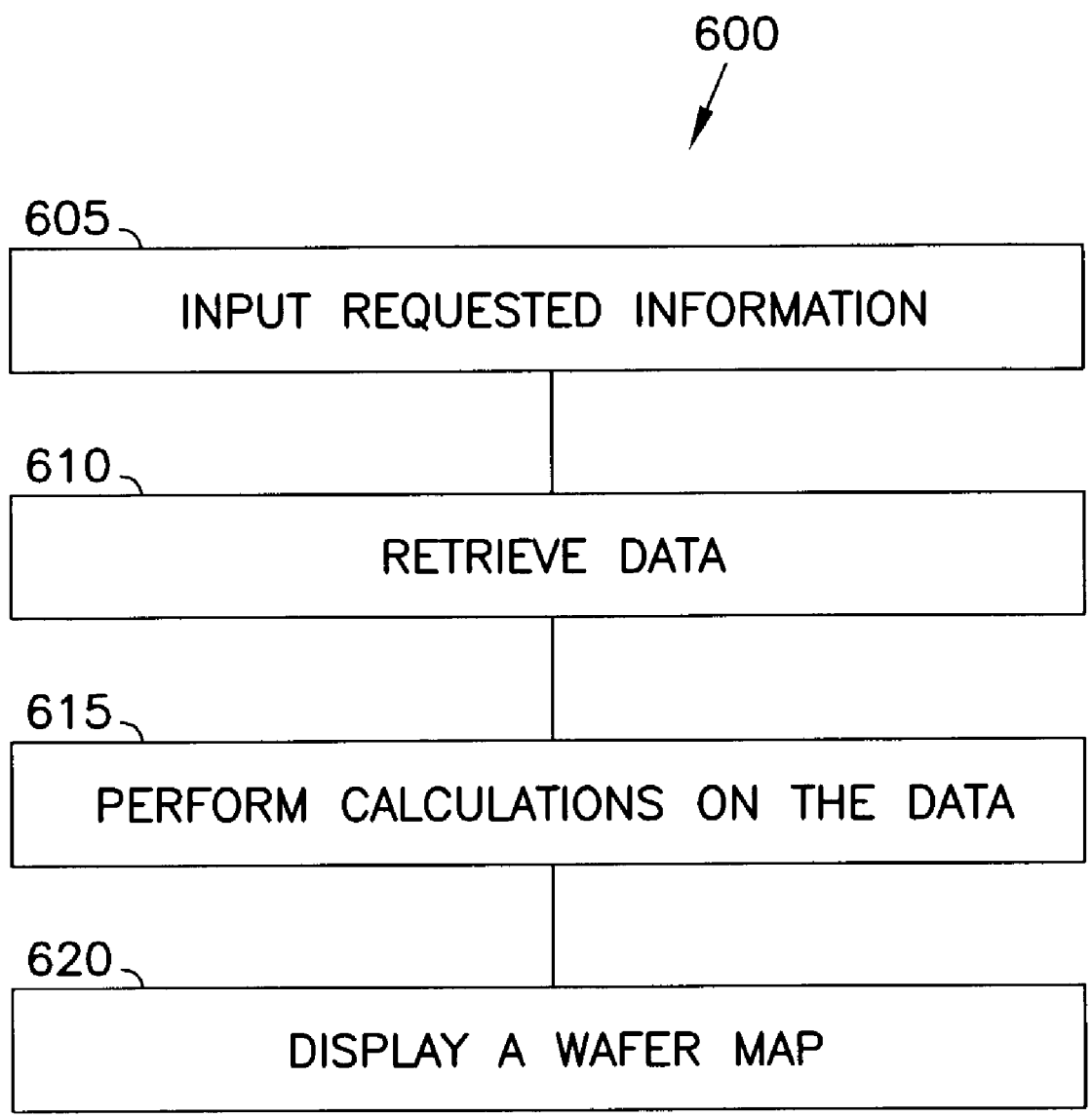
FIG. 6 is a flow chart showing a method for analyzing data according to an embodiment of the invention.

FIG. 6 is a flow chart showing a method for analyzing data according to an embodiment of the invention. In some embodiments, method 600 analyzes test results such as that of FIG. 5. Method 600 analyzes the test results and gives calculation results including statistical results (values) and failure analysis.

Method 600 includes inputting requested information in box 605. For example, the requested information can be the name of a particular failure category and the quantity of wafers tested during a certain period. Based on the requested information, method 600 retrieves data or the test results in box 610.

Method 600 performs calculations on the data in box 615. For example, method 600 may calculate one or all of the following: a total number of failures of circuit dice at the same coordinate, a number of circuit dice at the same coordinate with at least one failure, an average number of failures of circuit dice at the same coordinate, and a mean value of circuit dice at the same coordinate with at least one failure.

Method 600 displays the calculation results as a wafer map in box 620. Method 600 can be performed using hardware, software, or a combination of both hardware and software.

FIG. 7 is a list showing an example of requested information according to an embodiment of the invention. List 700 includes requested information such as fabrication areas 1 through M or all fabrication areas, group (or lot) of wafers by group list or by date range, test program, layout type, design ID (product type or part number), and failure category. The requested information in list 700 can be used by method 600 (FIG. 6) to analyze data such as test results of FIG. 5.

FIG. 7 shows only exemplary requested information. In alternative embodiments of the invention, list 700 may contain other requested information.

Figure 8:
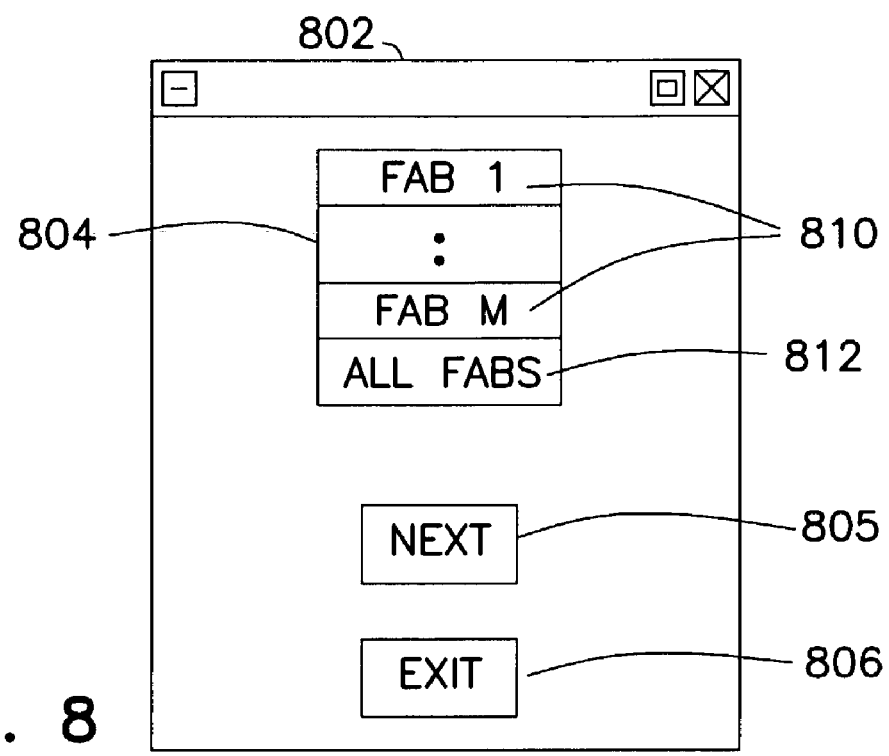
FIG. 8–FIG. 10 show examples of interactive windows according to embodiments of the inventions.
Figure 9:
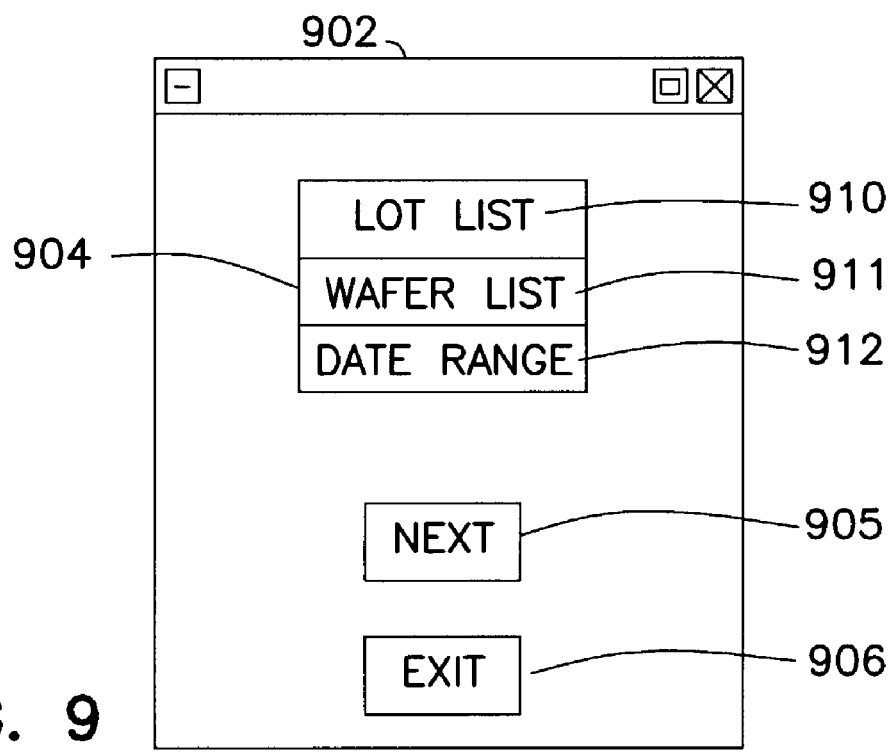
Figure 10:
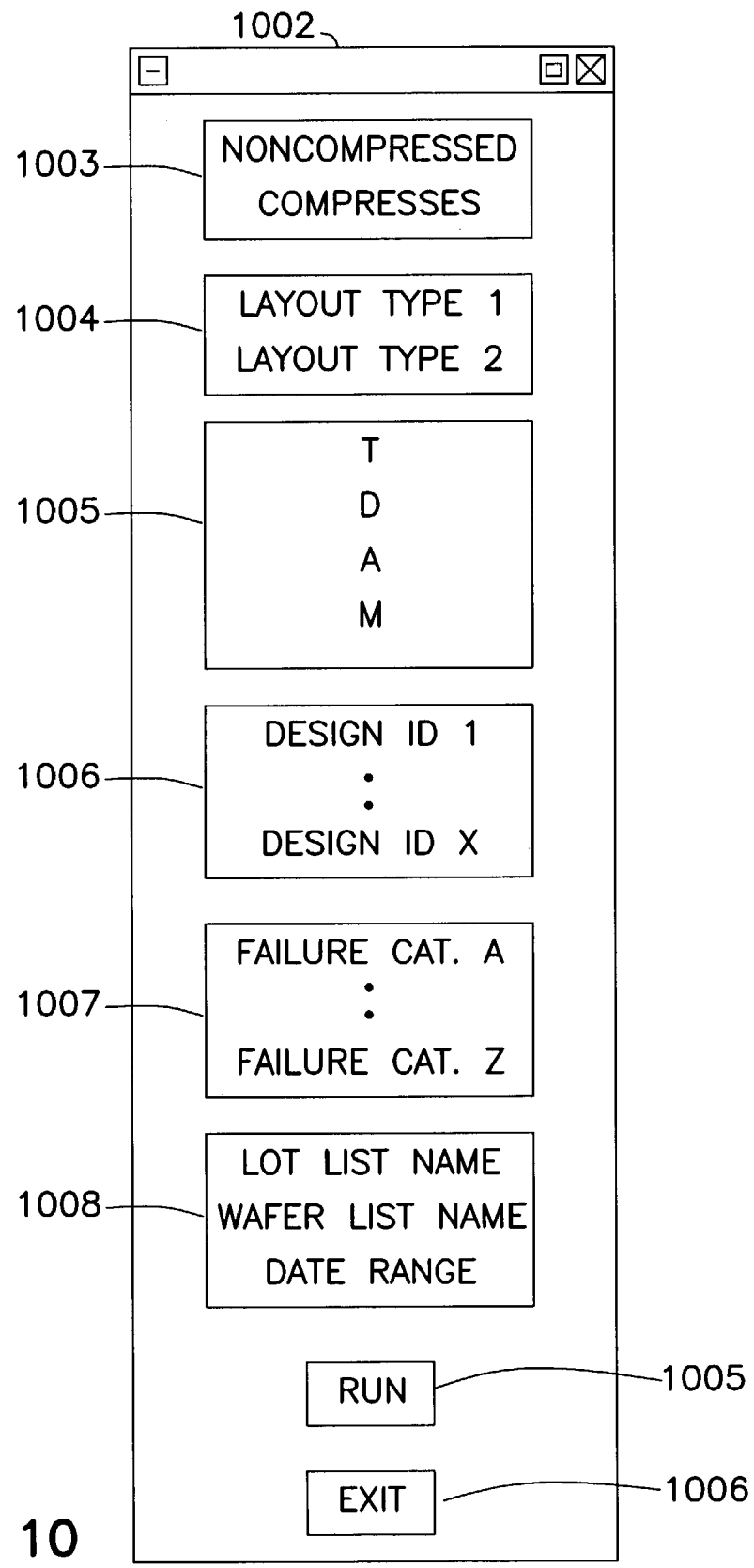

In some embodiments, the requested information in list 700 is shown in one or more interactive windows such as that of FIG. 8–FIG. 10.

FIG. 8–FIG. 10 show examples of interactive windows according to embodiments of the inventions. The interactive windows in FIG. 8–FIG. 10 can be used for inputting requested information during a method for analyzing data such as method 600 (FIG. 6). In FIG. 8, interactive window 802 shows field 804 having selection 810 and 812, each representing a particular fabrication area, for example, FAB 1 through FAB M, or ALL FABS. Each of these fabrication areas may produce a particular product. A "Next" button 805, when activated (clicked) activates a next interactive window. An "Exit" button 806, when activated, terminates the analysis at this stage without performing the analysis. During inputting of the requested information in a method such as method 600 (FIG. 6), appropriate data or selection can be selected or inputted in field 804.

In FIG. 9, interactive window 902 shows field 904 having selections 910, 911, and 912, each representing an input for selecting a group of wafers based on a particular category such as lot list, wafer list, or date range. A "Next" button 905, when activated (e.g. clicked) activates a next interactive window. An "Exit" button 906, when activated, exits the analysis at this stage without performing the analysis. During inputting requested information in a method such as method 600 (FIG. 6), appropriate data or selection can be selected or inputted in field 904.

In FIG. 10, interactive window 1002 shows a number of fields 1003–1008. Field 1003 indicates a list of test programs for selecting compressed or uncompressed bit maps. Field 1004 is used for selecting different layout types. Field 1005 is used for selecting various statistical functions including T, D, A, and M. T is the total number of failures of a certain failure category of all circuit dice at a particular coordinate. D is the number of circuit dice at a particular coordinate having at least one failure. A is the average number of failures of a certain failure category of all circuit dice at a particular coordinate. M is the arithmetic mean of the number of circuit dice at a particular coordinate having at least one failure.

Field 1006 selects design ID. Field 1007 is a list of electrical failure categories. Field 1008 is used for inputting information such as lot list file name, wafer list file name, or date range. A "Run" button 1005, when activated (clicked) activates the analysis based on the requested information. An "Exit" button 1006, when activated, exits the method without performing the analysis. During inputting requested information in a method such as method 600 (FIG. 6), appropriate data or selection can be selected or inputted in fields 1003–1008.

FIG. 11 is a table showing results of the analysis performed by a method according to an embodiment of the invention. For simplicity, FIG. 11 shows the results of the analysis of method such as method 600 (FIG. 6), in which the method performs analysis on the test results of three wafers (N=3) used in example of FIG. 3 and FIG. 5. In FIG. 11, the analysis gives calculation results for four variables: $T(x_i,y_j)$, $D(x_i,y_j)$, $A(x_i,y_j)$, and $M(x_i,y_j)$. These four variables are also referred to as statistical categories or statistical values.

$T(x_i,y_j)$ is the total number of failures of a certain failure category of all circuit dice (ICs) at a particular coordinate $(x_i,y_j)$ of a certain number of wafers. $T(x_i,y_j)$ is calculated based on the formula:

$$T(x_i, y_j) = \sum_{k=1}^{N} ICw_k(x_i, y_j)$$

where $ICw_k$ is a circuit die at coordinate $(x_i,y_j)$ of wafer k $(w_k)$, and N is the total number of wafers. Thus, in FIG. 11, $T(x_i,y_j)=ICw_1(x_i,y_j)+ICw_2(x_i,y_j)+ICw_3(x_i,y_j)=3+5+0=8$, which is the total number of failures of failure category B of all circuit dice at coordinate $(x_i,y_j)$) of wafers 1, 2 and 3.

$D(x_i,y_j)$ is the number of circuit dice at a particular coordinate $(x_i,y_j)$ having at least one failure of a certain number of wafers. $D(x_i,y_j)$ is calculated based on the formula:

$$D(x_i, y_j) = \sum_{k=1}^{N} F(ICw_k(x_i, y_j))$$

In this formula, if $ICw_k(x_i,y_j)=0$ (a circuit die has no failure for a certain failure category), then $F(ICw_k(x_i,y_j))=0$. However, if $ICw_k(x_i,y_j) \geq 1$ (a die has at least one failure for a certain failure category), then $F(ICw_k(x_i,y_j))=1$. For example, in FIG. 11, in wafer 1, $Icw_1(x_i,y_j)$ has three failures for failure category B. Thus, $F(Icw_1(x_i,y_j))=1$. In wafer 2, $Icw_2(x_i,y_j)$ has five failures for failure category B. Thus, $F(Icw_2(x_i,y_j))=1$. In wafer 3, $Icw_3(x_i,y_j)$ has zero failures for failure category B. Thus, $F(Icw_3(x_i,y_j))=0$.

Hence, in FIG. 11, $D(x_i,y_j)=F(ICw_1(x_i,y_j))+F(ICw_2((x_i,y_j))+F(ICw_3(x_i,y_j))=1+1+0=2$, which is the number of circuit dice of wafers 1, 2 and 3 at a particular coordinate $(x_i,y_j)$ having at least one failure.

$A(x_i,y_j)$ is the average number of failures of a certain failure category of all circuit dice at a particular coordinate $(x_i,y_j)$ of a certain number of wafers. $A(x_i,y_j)$ is calculated based on the formula:

$$A(x_i, y_j) = \left(\frac{1}{N}\right) \sum_{k=1}^{N} ICw_k(x_i, y_j)$$

Therefore, in FIG. 11, $$A(x_i, y_j) = \left(\frac{1}{N}\right)[ICw_1(x_i, y_j) + ICw_2(x_i, y_j) + ICw_3(x_i, y_j)]$$
$$= (1/3)(3 + 5 + 0)$$
$$= 2.67,$$

which is the average of failure category B of all circuit dice at coordinate $(x_i,y_j)$ among a certain number of wafers.

$M(x_i,y_j)$ is the arithmetic mean of the number of circuit dice at a particular coordinate $(x_i,y_j)$ having at least one failure. $M(x_i,y_j)$ is calculated based on the formula:

$$M(x_i, y_j) = \left(\frac{1}{N}\right) \sum_{k=1}^{N} F(ICw_k(x_i, y_j))$$

Thus, in FIG. 11, $$M(x_i, y_j) = \left(\frac{1}{N}\right)[F(ICw_1(x_i, y_j)) + F(ICw_2(x_i, y_j)) + F(ICw_3(x_i, y_j))]$$
$$= (1/3)(1 + 1 + 0)$$
$$= 0.67,)$$

is the arithmetic mean of the number of circuit dice at a particular coordinate $(x_i,y_j)$ having at least one failure of wafers 1, 2 and 3.

In some embodiments, besides, $T(x_i,y_j)$, $D(x_i,y_j)$, $A(x_i,y_j)$, and $M(x_i,y_j)$, method 600 (FIG. 6) performs other calculations on the test results. For example, method 600 may calculate the standard deviation of a certain category for all circuit dice at a particular coordinate.

Method 600 may be carried out by any combination of hardware, software, and other calculating means. For example, the hardware may be logic circuits or circuits that perform math functions. An example of software may include computer program or programming instructions.

Figure 12:
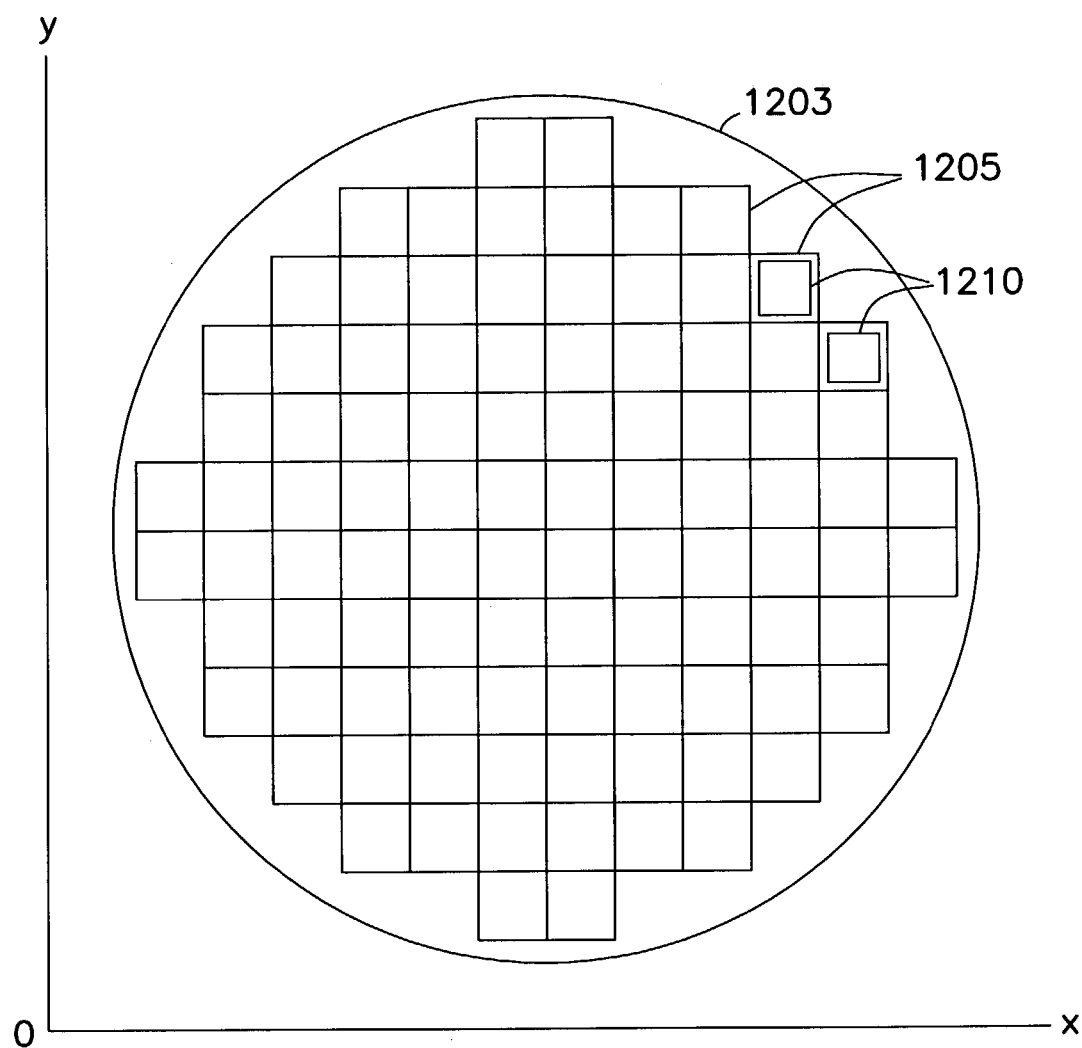
FIG. 12 is a template wafer map for showing results of the analysis performed by a method according to an embodiment of the invention.

FIG. 12 is a template wafer map for showing results of the analysis performed by a method according to an embodiment of the invention. Referring to FIG. 4, each of the wafer maps 403.1–403.3 shows test results of only a single wafer. In FIG. 12 wafer map 1203 shows a statistical combination of test results of multiple wafers. Wafer map 1203 represents a statistical combination of all wafers 103.1–103.N (FIG. 1). Wafer map 1203 includes a plurality of map sections 1205 and an x-y coordinate system. Each of the map sections 1205 represents all circuit dice (ICs) 101 of wafers 103.1–103.N at a corresponding (x,y) coordinate. Each of the map sections 1205 includes an indicator 1210, which holds identifying information representing a calculation result for all circuit dice at a particular (x,y) coordinate. The identifying information in each map section 1205 may be a number, a color, a symbol, or other types of information as described below in FIG. 13–FIG. 15. For simplicity, FIG. 12 shows only two indicators 1210.

Figure 13:
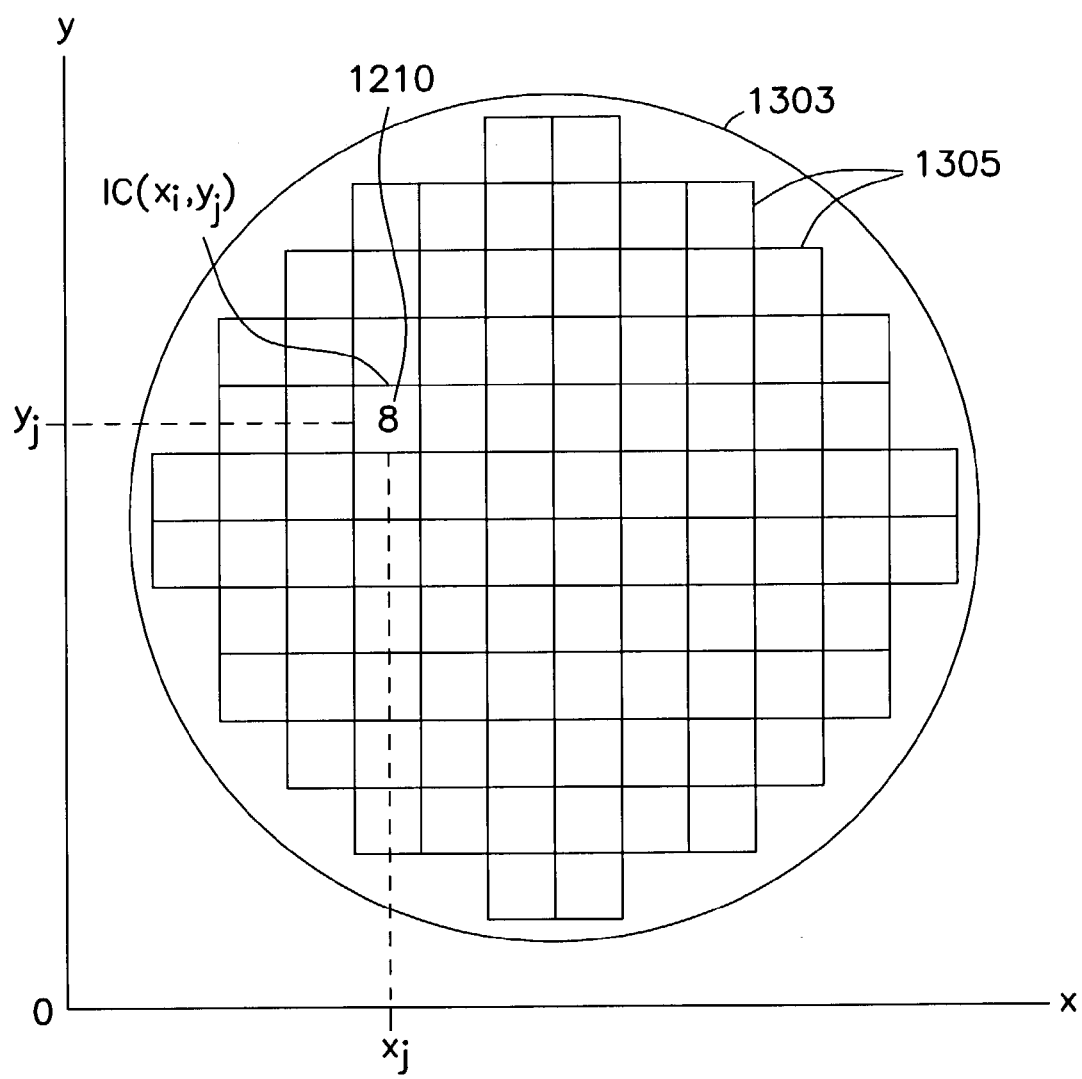
FIG. 13 shows a wafer map having numbers used as identifying information according to an embodiment of the invention.

FIG. 13 shows a wafer map having numbers used as identifying information according to an embodiment of the invention. Wafer map 1303 includes many map sections 1305, each having a number representing a statistical value for a certain failure category of all the circuit dice at the corresponding (x,y) coordinate of multiple wafers. The example of FIG. 11 is used again in FIG. 13. The map section 1305 at coordinate $(x_i,y_j)$ displays number 8, which is the total number of failures $T(x_i,y_j)$ for failure category B of all IC $(x_i,y_j)$ of wafers 1, 2, and 3.

As a result of the analysis, each of the map sections 1305 at other coordinates besides $(x_i,y_j)$ also displays a number representing the statistical value for failure category B of all the dice at each of the others corresponding coordinates of wafers 1, 2, and 3. However, the other numbers are omitted for simplicity. The pattern of the numbers (statistical values) displayed on wafer map 1303 can be studied to discover patterns useful in correcting the failures to improve the yield.

In embodiments of FIG. 13, wafer map 1303 of FIG. 13 displays the total number of failures $T(x_i,y_j)$ for category B of all the dice at the same coordinate among the wafers 1, 2, and 3. In some embodiments, wafer map 1303 of FIG. 13 displays numbers representing calculation results for other statistical values for variables such as $D(x_i,y_j)$, $A(x_i,y_j)$, and $M(x_i,y_j)$ when these variables are selected during the requested information section (FIG. 10). In FIG. 10, the selections for $T(x_i,y_j)$ $D(x_i,y_j)$, $A(x_i,y_j)$, and $M(x_i,y_j)$ are shown as T, D, A, and M. For example, when the average number of failure $A(x_i,y_j)$ for category B is selected, map section 1305 at $(x_i,y_j)$ displays number 2.67 and map sections at other coordinates display other average numbers.

Figure 14:
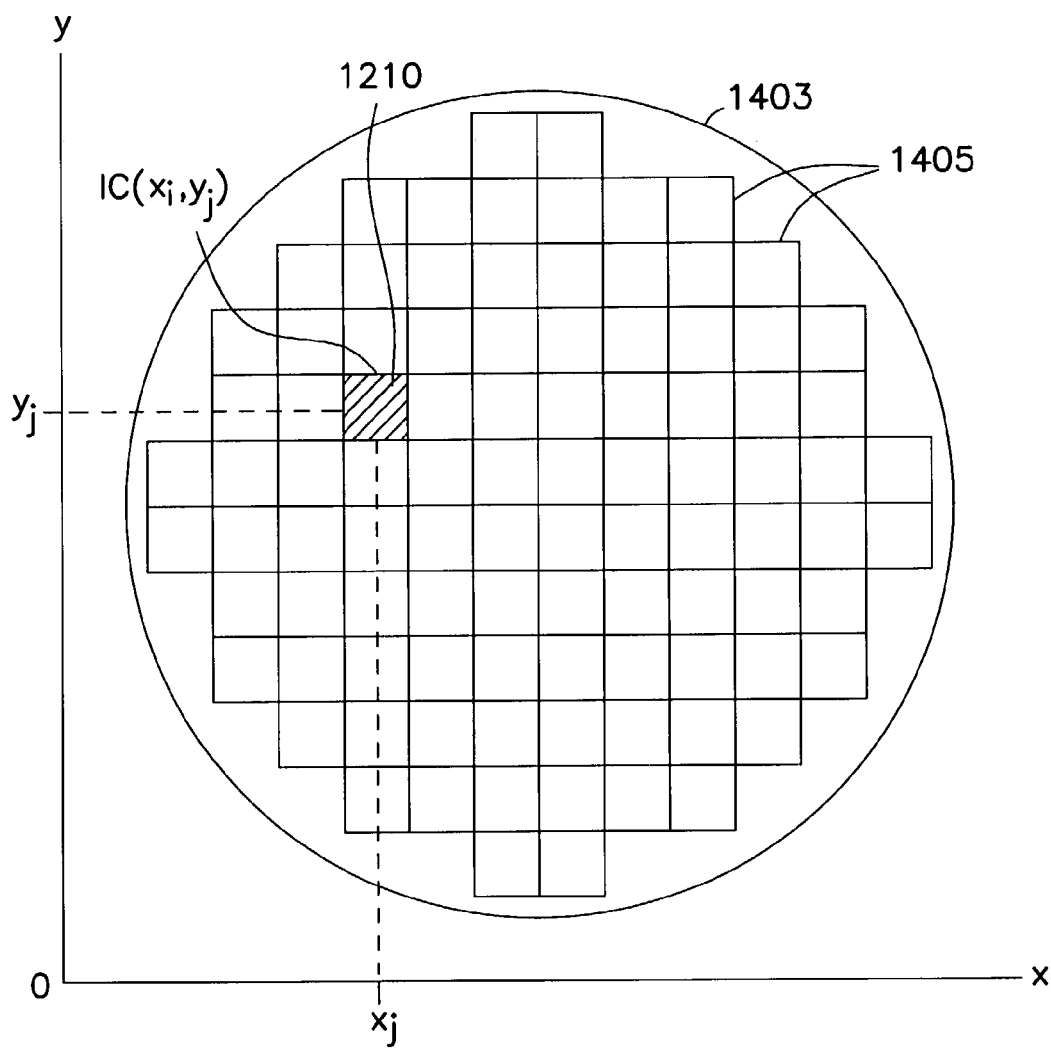
FIG. 14–FIG. 15 show wafer maps having color used as identifying information according to an embodiment of the invention.

FIG. 14 shows a wafer map having gradient colors used as identifying information according to an embodiment of the invention. Wafer map 1403 includes a number of map sections 1405, each having a gradient color representing a statistical value for a certain failure category of all the circuit dice at the corresponding (x,y) coordinate of multiple wafers. In FIG. 14, since the drawing is in black and white, the gradient color in each of the map sections is indicated by a hatched pattern. In reality, each hatched pattern is a real color associated with a certain RGB (red, green, blue) value.

Different colors (hatched pattern) represent different statistical values or range of statistical values.

The Example of FIG. 11 is used again in FIG. 14. Map section 1405 at coordinate $(x_i,y_j)$ displays a 45 degree hatched pattern, which represents the total number of failures of all IC $(x_i,y_j)$ of wafers 1, 2, and 3 for failure category B. In reality, the 45 degree hatch pattern is a color (e.g. yellow). As a result of the analysis, each of the map sections 1405 at other coordinates besides $(x_i,y_j)$ also displays a hatched pattern representing the statistical value for failure category B of all the dice at each of the others corresponding coordinates of wafers 1, 2, and 3. The pattern of the color (hatched pattern) displayed on wafer map 1403 can be studied to discover patterns useful in correcting the failures to improve the yield.

In some embodiments, instead of using different colors to represent different statistical values or a different range of statistical values, elements associated with color such as intensity, brightness, contrast, and others can also be used. For example, different intensity, brightness, or contrast of the same color can be used to represent different statistical values or a different range of statistical values.

Figure 15:
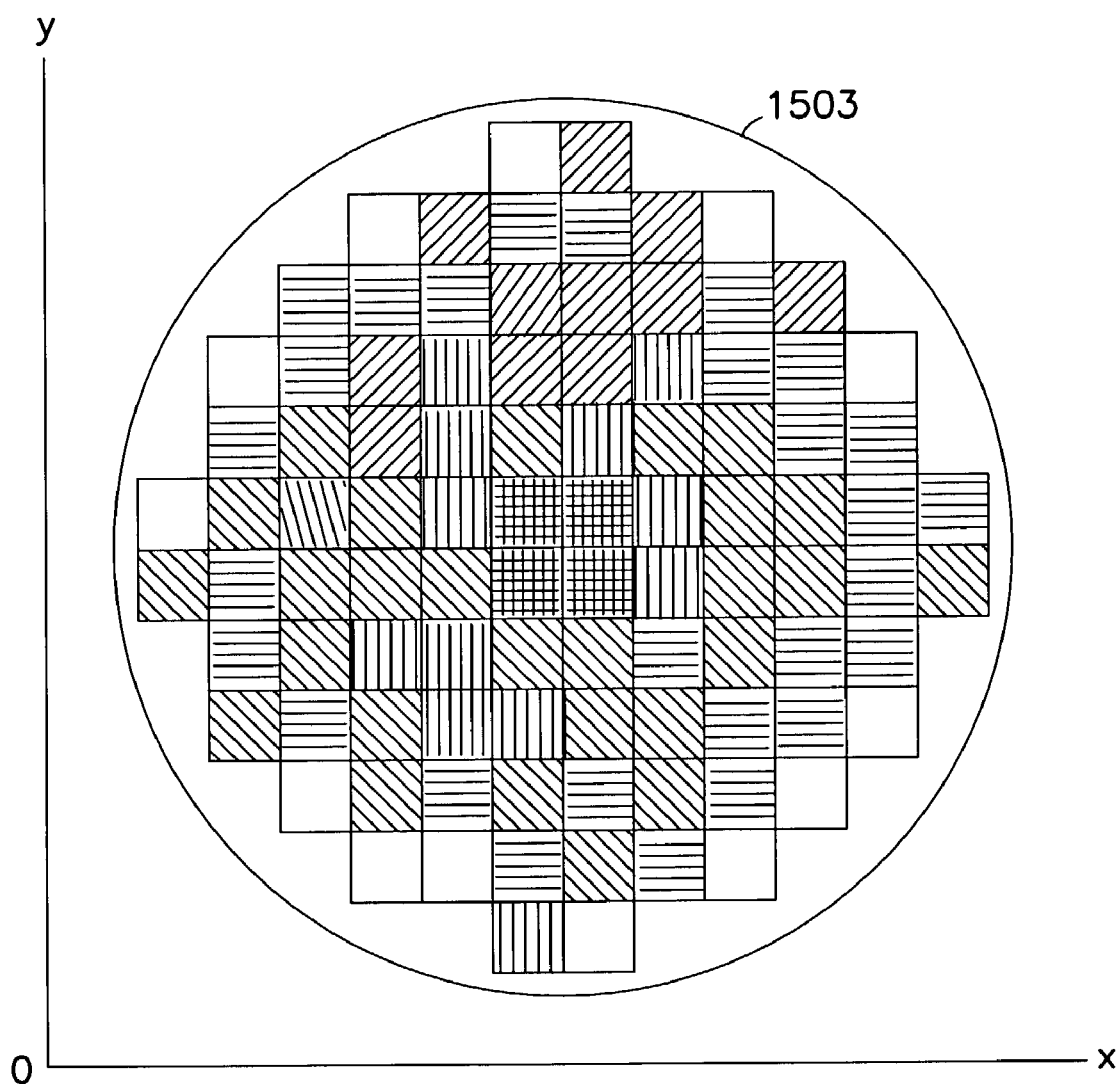

After the analysis, wafer map 1403 may show a gradient color map such as wafer map 1503 shown in FIG. 15, which can be studied to discover patterns useful in correcting to correct the failures to improve the yield.

Figure 16:
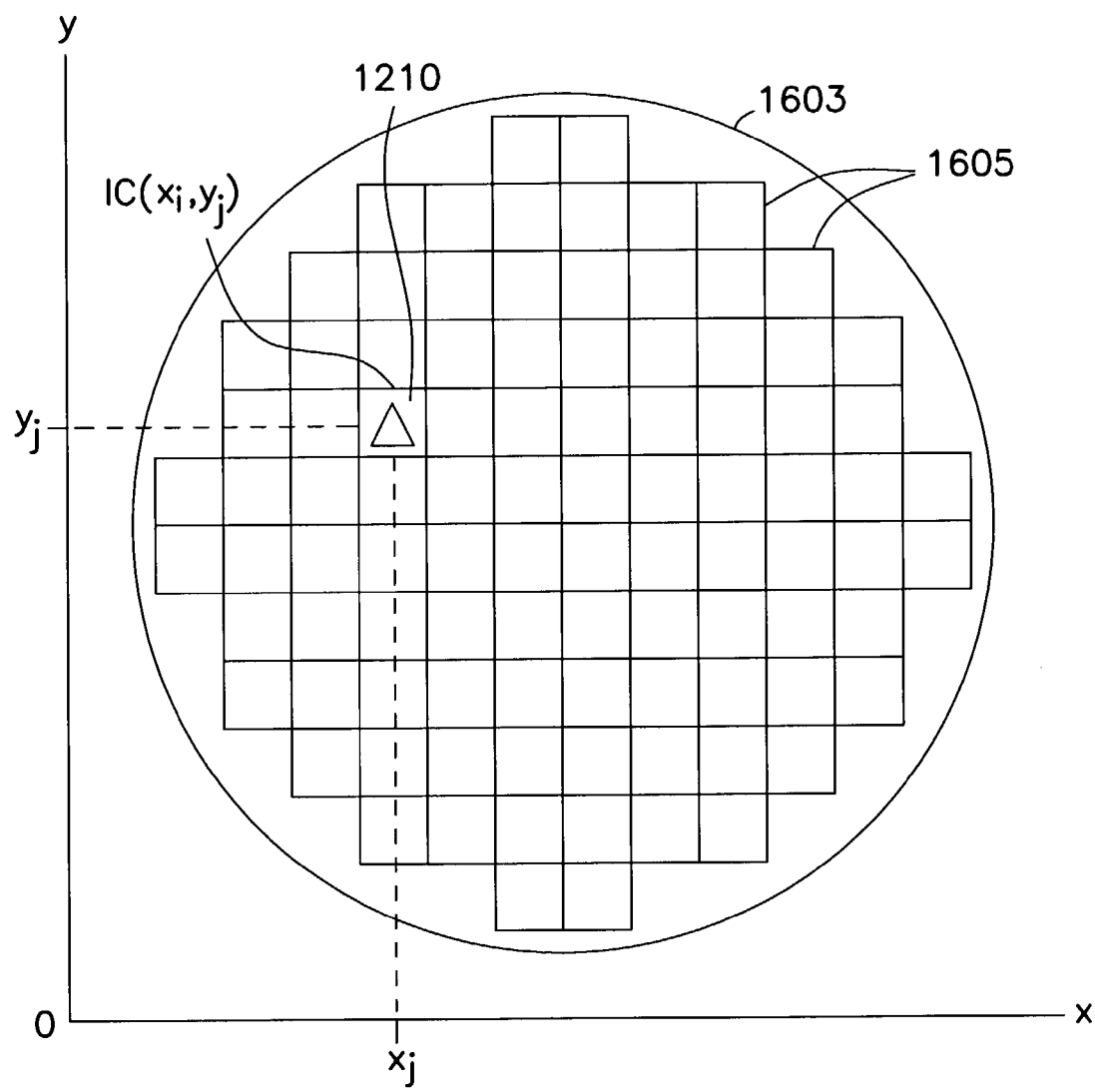
FIG. 16 shows a wafer map having symbols used as identifying information according to an embodiment of the invention.

FIG. 16 shows a wafer map having symbols used as identifying information according to an embodiment of the invention. Wafer map 1603 includes a number of map sections 1605, each having a symbol representing a statistical value for a certain failure category of the all circuit dice at the corresponding (x,y) coordinate of multiple wafers. A single calculation result (value) or a range of calculation results (values) may be assigned to a particular symbol. A calculation result may be one of the four statistical values $T(x_i,y_j)$, $D(x_i,y_j)$, $A(x_i,y_j)$, and $M(x_i,y_j)$. For example, a calculation result ranging from zero to ten may be assigned to a triangle symbol. Other calculation results in other ranges may be assigned to other symbols. Thus, based on the example of FIG. 11 wafer map section 1605 at coordinate $(x_i,y_j)$ displays a triangle symbol because the calculation result $T(x_i,y_j)$ for failure category B of all the dice at coordinate $(x_i,y_j)$ of wafers 1, 2, and 3 is eight, which is within the range of zero to ten. The pattern of symbols in wafer map 1603 may be used to study the failures to improve the yield.

Figure 17:
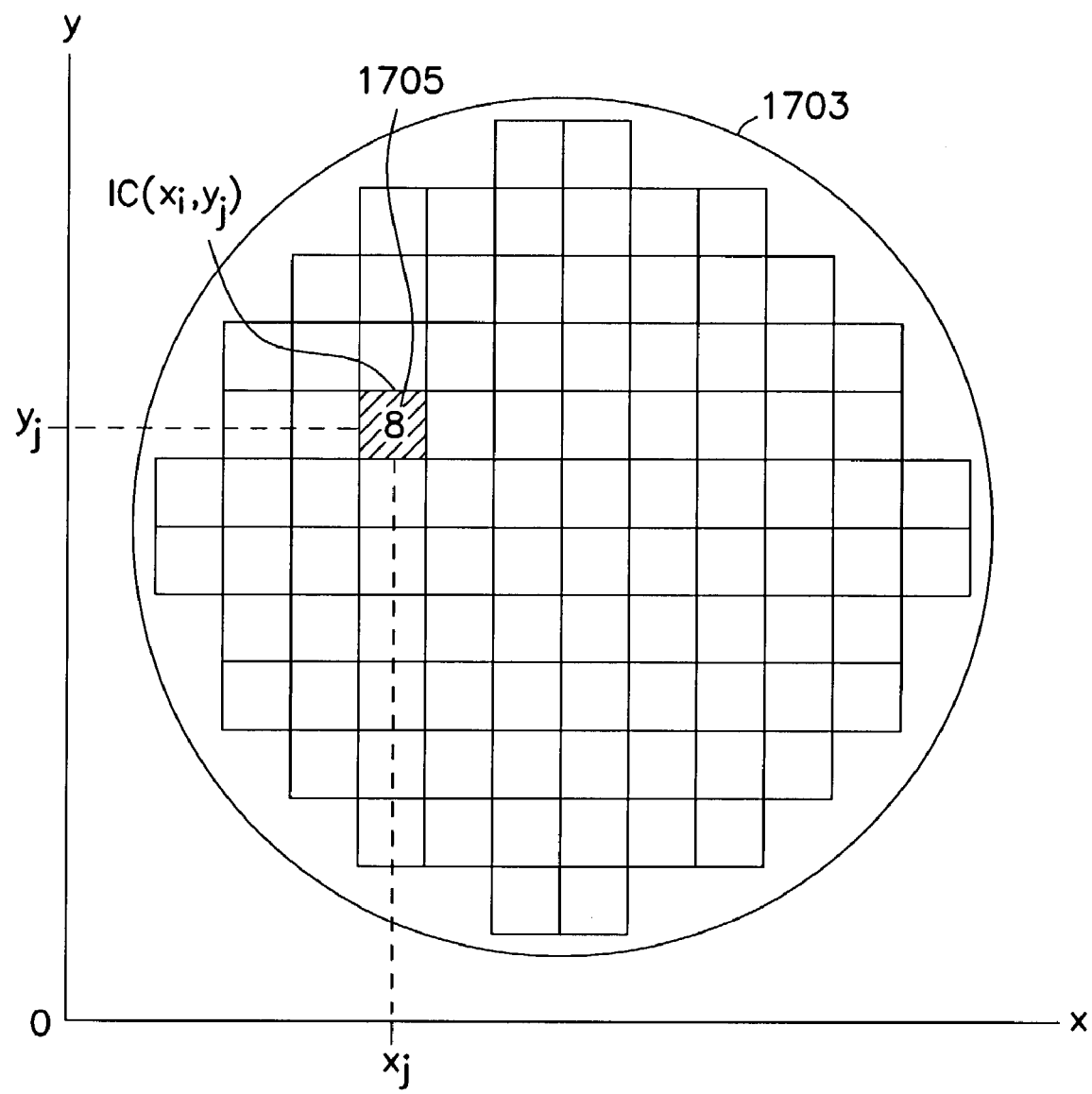
FIG. 17 shows a wafer map having a combination of a number and a color displayed simultaneously as identifying information according to an embodiment of the invention.

In some embodiments, any combination of the indicators 1210 (a number, a color, and a symbol) can be simultaneously displayed in one map section of the wafer map. For example, both number and color of FIG. 13 and FIG. 14 corresponding to a statistical value $T(x_i,y_j)$ can be displayed simultaneously in map section 1705 of wafer map 1703 of FIG. 17.

CONCLUSION

Various embodiments of the invention provide a system and method for an efficient analysis of electrical failures of semiconductor devices. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data;
displaying a wafer map, wherein the wafer map includes a plurality of map sections representing the circuit dice of the group of wafers, wherein each of the map sections includes a single symbol representing a calculation result for electrical failure for the circuit dice, wherein each of the circuit dice belongs to a separate wafer among the group of wafers, and wherein the circuit dice are located at the same coordinate.

2. The method of claim 1, wherein the single symbol represents a total number of all failures of a particular type of circuit dice at the same coordinate.

3. The method of claim 1, wherein the single symbol represents a number of circuit dice at the same coordinate with at least one failure of any type.

4. The method of claim 1, wherein the single symbol represents an average number of failures of a particular type of circuit dice at the same coordinate.

5. The method of claim 1, wherein the single symbol represents a mean value of circuit dice at the same coordinate with at least one failure of a particular type.

6. The method of claim 1, wherein the requested information includes one or more of the following: a statistical category, failure category used during testing of the wafers, type of the wafers, and range of date of the data associated with a group of wafers.

7. The method of claim 1, wherein the data associated with a group of wafers includes a number of failures of a certain failure category recorded during a test of the group of wafers.

8. The method of claim 1, wherein the coordinate is a two dimensional coordinate.

9. The method of claim 1, wherein the single symbol represents a range of values of the calculation result.

10. A system comprising:
a tester for testing a plurality of wafers;
a storage unit connected to the tester for storing test results from testing the wafers; and
an analyzer connected to the storage unit for analyzing the test results, the analyzer including:
a calculating unit for performing a calculation on the test results; and
a display unit for displaying results from the calculation in the form of a wafer map, wherein the wafer map includes a plurality of map sections representing the circuit dice of the plurality of wafers, wherein each of the map sections includes a single indicator representing a calculation result for electrical failure for the circuit dice, wherein each of the circuit dice belongs to a separate wafer among the plurality of wafers, and wherein the circuit dice are located at the same coordinate.

11. The system of claim 10, further comprising a communication interface for communicating data to and from the system.

12. The system of claim 11, wherein the communication interface includes any combination of a modem, a network card, a wireless receiver, and a wireless transmitter.

13. The system of claim 10, wherein the input device is selected from the group consisting of a keyboard, a computer mouse, and a touch pad.

14. The system of claim 10, wherein the analyzer includes a processor.

15. The system of claim 10, wherein the calculating unit includes any combination of a memory device for holding programming instructions and logic circuits for performing math functions.

16. The system of claim 10, wherein the circuit dice of the plurality of wafers include memory devices.

17. The system of claim 10, wherein the circuit dice of the plurality of wafers include processors.

18. A machine-readable medium having instructions stored thereon for causing a machine to perform a method, the method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data associated with the group of wafers;
displaying a wafer map, wherein the wafer map includes a plurality of map sections representing the circuit dice of the group of wafers, wherein each of the map sections includes a single indicator representing a calculation result for electrical failure for the circuit dice, wherein each of the circuit dice belongs to a separate wafer among the group of wafers, and wherein the circuit dice are located at the same coordinate.

19. The machine-readable medium of claim 18 includes an optical disk.

20. The machine-readable medium of claim 18 includes a magnetic disk.

21. The machine-readable medium of claim 18, wherein the requested information includes one or more of the following: a statistical category, failure category used during testing of the wafers, type of the wafers, and range of date of the data associated with the group of wafers.

22. The machine-readable medium of claim 18, wherein the data associated with the group of wafers includes a number of failures of a certain failure category recorded during a test of the group of wafers.

23. The machine-readable medium of claim 18, wherein the calculation result include one of the following: a total number of failures of circuit dice at the same coordinate, a number of circuit dice at the same coordinate with at least one failure, an average number of failures of circuit dice at the same coordinate, and a mean value of circuit dice at the same coordinate with at least one failure.

24. The machine-readable medium of claim 18, wherein each of the map sections is located at a coordinate matching a coordinate of one of the circuit dice of each wafer of the group of wafers.

25. The machine-readable medium of claim 18, wherein the coordinate is a two dimensional coordinate.

26. A method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data;
displaying a wafer map, wherein the wafer map includes a plurality of map sections representing the circuit dice of the group of wafers, wherein each of the map sections includes a number representing a calculation result for circuit dice located at the same coordinate among the wafers.

27. The method of claim 26, wherein the number represents a total number of all failures of a particular type of circuit dice at the same coordinate.

28. The method of claim 26, wherein the number represents a number of circuit dice at the same coordinate with at least one failure of any type.

29. The method of claim 26, wherein the number represents an average number of failures of a particular type of circuit dice at the same coordinate.

30. The method of claim 26, wherein the number represents a mean value of circuit dice at the same coordinate with at least one failure of a particular type.

31. The method of claim 26, wherein the requested information includes one or more of the following: a statistical category, failure category used during testing of the wafers, type of the wafers, and range of date of the data.

32. The method of claim 26, wherein the data includes a number of failures of a certain failure category recorded during a test of the group of wafers.

33. The method of claim 26, wherein the coordinate is a two dimensional coordinate.

34. A method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data associated with a group of wafers;
displaying a wafer map, wherein the wafer map includes a plurality of map sections representing the circuit dice of the group of wafers, wherein each of the map sections includes a single color representing a calculation result for electrical failure for the circuit dice, wherein each of the circuit dice belongs to a separate wafer among the group of wafers, and wherein the circuit dice are located at the same coordinate.

35. The method of claim 34, wherein the single color represents a total number of all failures of a particular type of circuit dice at the same coordinate.

36. The method of claim 34, wherein the single color represents a number of circuit dice at the same coordinate with at least one failure of any type.

37. The method of claim 34, wherein the single color represents an average number of failures of a particular type of circuit dice at the same coordinate.

38. The method of claim 34, wherein the single color represents a mean value of circuit dice at the same coordinate with at least one failure of a particular type.

39. The method of claim 34, wherein the requested information includes one or more of the following: a statistical category, failure category used during testing of the wafers, type of the wafers, and range of date of the data associated with a group of wafers.

40. The method of claim 34, wherein the data associated with a group of wafers includes a number of failures of a certain failure category recorded during a test of the group of wafers.

41. The method of claim 34, wherein the coordinate is a two dimensional coordinate.

42. A system comprising:
an input device for inputting requested information;
a controller connected to the input unit for retrieving data associated with a group of wafers based on the requested information, wherein each wafer in the group of wafers includes at least one circuit dice, wherein each of the circuit dice is located at a coordinate;
a calculating unit for performing a calculation on the data associated with the group of wafers; and
a display unit for displaying results from the calculation in the form of a wafer map, wherein the wafer map includes a plurality of map sections representing the circuit dice of the group of wafers, wherein each of the map sections is configured for simultaneously displaying a first displaying element and a second displaying element, wherein each of the first and second displaying elements represents a calculation result for electrical failure of the circuit dice, wherein each of the circuit dice belongs to a separate wafer among the group of wafers, and wherein the circuit dice are located at the same coordinate.

43. The system of claim 42, wherein the first displaying element includes a symbol, and wherein the second displaying element includes a number.

44. The system of claim 42, wherein the first displaying element includes a symbol, and wherein the second displaying element includes a color.

45. The system of claim 42, wherein the calculation result represented by each of the first and second displaying elements includes a total number for electrical failures for the circuit dice at the same coordinate.

46. The system of claim 42, wherein the calculation result represented by each of the first and second displaying elements includes a number of circuit dice at the same coordinate with at least one electrical failure.

47. The system of claim 42, wherein the calculation result represented by each of the first and second displaying elements includes an average number for electrical failures for the circuit dice at the same coordinate.

48. The system of claim 42, wherein calculation result represented by each of the first and second displaying elements includes a mean value of circuit dice at the same coordinate with at least one electrical failure.

49. A method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data associated with the group of wafers;
displaying a wafer map, wherein the wafer map includes a plurality of map sections representing the circuit dice of the group of wafers, wherein each of the map sections includes a single indicator representing a calculation result for electrical failure for the circuit dice, wherein each of the circuit dice belongs to a separate wafer among the group of wafers, and wherein the circuit dice are located at the same coordinate.

50. The method of claim 49, wherein the requested information includes one or more of the following: a statistical category, failure category used during testing of the wafers, type of the wafers, and range of date of the data associated with a group of wafers.

51. The method of claim 49, wherein the data associated with the group of wafers includes a number of failures of a certain failure category recorded during a test of the group of wafers.

52. The method of claim 49, wherein the calculation result include one of the following: a total number of failures of circuit dice at the same coordinate, a number of circuit dice at the same coordinate with at least one failure, an average number of failures of circuit dice at the same coordinate, and a mean value of circuit dice at the same coordinate with at least one failure.

53. The method of claim 49, wherein each of the map sections is located at a coordinate matching a coordinate of one of the circuit dice of each wafer of the group of wafers.

54. The method of claim 49, wherein the coordinate is a two dimensional coordinate.

55. A system comprising:
an input device for inputting requested information;
a controller connected to the input unit for retrieving data associated with a group of wafers based on the requested information, wherein each wafer in the group of wafers includes at least one circuit dice, wherein each of the circuit dice is located at a coordinate;
a calculating unit for performing a calculation on the data associated with the group of wafers; and
a display unit for displaying results from the calculation in the form of a wafer map, wherein the wafer map includes a plurality of map sections representing the circuit dice of the group of wafers, wherein each of the map sections is configured for displaying a displaying number within a border of each of the map sections, wherein the displaying number represents a calculation result for electrical failure for the circuit dice, wherein each of the circuit dice belongs to a separate wafer among the group of wafers, and wherein the circuit dice are located at the same coordinate.

56. The system of claim 55, wherein the calculation result represented by the displaying number includes a total number for electrical failures for the circuit dice at the same coordinate.

57. The system of claim 55, wherein the calculation result represented by the displaying number includes a number of circuit dice at the same coordinate with at least one electrical failure.

58. The system of claim 55, wherein the calculation result represented by the displaying number includes an average number for electrical failures for the circuit dice at the same coordinate.

59. The system of claim 55, wherein calculation result represented by the displaying number includes a mean value of circuit dice at the same coordinate with at least one electrical failure.

60. A system comprising:
an input device for inputting requested information;
a controller connected to the input unit for retrieving data associated with a group of wafers based on the requested information, wherein each wafer in the group of wafers includes one or more circuit dice, wherein each of the circuit dice is located at a coordinate;
a calculating unit for performing a calculation on the data associated with the group of wafers; and
a display unit for displaying results from the calculation in the form of a wafer map, wherein the wafer map includes a plurality of map sections representing the circuit dice of the group of wafers, wherein each of the map sections includes a single indicator representing a calculation result for electrical failure for the circuit dice, wherein each of the circuit dice belongs to a separate wafer among the group of wafers, and wherein the circuit dice are located at the same coordinate.

61. The system of claim 1, wherein the data associated with the group of wafers includes test results of the group of wafers.

62. The system of claim 61, wherein the test results include results of electrical function tested on the group of wafers.

63. The system of claim 1, wherein the requested information includes one or more of the following: a statistical category, failure category used during testing of the group of wafers, type of the group of wafers, and range of date of the data associated with the group of wafers.

64. The system of claim 1, wherein the calculating unit includes any combination of a memory device for holding programming instructions and a logic circuit for performing math functions.

65. A method comprising:
inputting requested information;
retrieving data associated with a group of wafers based on the requested information, wherein each wafer in the group of wafers includes one or more circuit dice, wherein each of the circuit dice is located at a coordinate;
performing a calculation on the data;
displaying a wafer map, wherein the wafer map includes a plurality of map sections representing the circuit dice of the group of wafers, wherein each of the map sections includes a color representing a calculation result for circuit dice located at the same coordinate among the wafers, wherein each of the map sections further includes a number representing one of the following: a total number of failures of circuit dice at the same coordinate, a number of circuit dice at the same coordinate with at least one failure, an average number of failures of circuit dice at the same coordinate, and a mean value of circuit dice at the same coordinate with at least one failure.

66. The method of claim 65, wherein an intensity, brightness, and contrast of the color is controlled by a value of the number in each of the map sections.

* * * * *

UNITED STATES PATENT AND TRADEMARK OFFICE
CERTIFICATE OF CORRECTION

| | | |
|---|---|---|
| PATENT NO. | : 7,319,935 B2 | Page 1 of 1 |
| APPLICATION NO. | : 10/365997 | |
| DATED | : January 15, 2008 | |
| INVENTOR(S) | : Sun et al. | |

It is certified that error appears in the above-identified patent and that said Letters Patent is hereby corrected as shown below:

In column 15, line 4, in Claim 61, delete "claim 1," and insert -- claim 60, --, therefor.

In column 15, line 10, in Claim 63, delete "claim 1," and insert -- claim 60, --, therefor.

In column 15, line 15, in Claim 64, delete "claim 1," and insert --claim 60, --, therefor.

Signed and Sealed this

Sixth Day of May, 2008

JON W. DUDAS
*Director of the United States Patent and Trademark Office*